United States Patent
Shim et al.

(10) Patent No.: US 8,154,314 B2
(45) Date of Patent: Apr. 10, 2012

(54) SIDE-DOCKING TYPE TEST HANDLER AND APPARATUS FOR TRANSFERRING TEST TRAY FOR SAME

(75) Inventors: Jae Gyun Shim, Suwon-si (KR); Yun Sung Na, Cheonan-si (KR); In Gu Jeon, Suwon-si (KR); Dong Hyun Yo, Bucheon-si (KR); Bong Soo Kim, Suwon-si (KR); Choung Min Joung, Uijeongbu-si (KR)

(73) Assignee: Techwing Co., Ltd., Gyeonggi-do (KR)

( * ) Notice: Subject to any disclaimer, the term of this patent is extended or adjusted under 35 U.S.C. 154(b) by 332 days.

(21) Appl. No.: 12/415,662

(22) Filed: Mar. 31, 2009

(65) Prior Publication Data
US 2009/0199395 A1 Aug. 13, 2009

Related U.S. Application Data

(63) Continuation of application No. PCT/KR2007/004635, filed on Sep. 21, 2007.

(30) Foreign Application Priority Data

Oct. 4, 2006 (KR) .................. 10-2006-0097495

(51) Int. Cl.
*G01R 31/00* (2006.01)
(52) U.S. Cl. ......... 324/750.13; 414/225.01; 414/331.04; 198/607; 198/626.1; 198/347.1
(58) Field of Classification Search ............. 324/750.13; 414/225.01, 331.04; 198/607, 626.1, 347.1
See application file for complete search history.

(56) References Cited

U.S. PATENT DOCUMENTS

| 2,678,151 | A | * | 5/1954 | Geisler ......................... 53/496 |
| 5,088,589 | A | * | 2/1992 | Geerts ...................... 198/457.05 |
| 5,113,992 | A | * | 5/1992 | Sadamori ................... 198/347.3 |
| 5,168,886 | A | * | 12/1992 | Thompson et al. ........... 134/153 |
| 5,478,184 | A | * | 12/1995 | Bryant et al. ............ 414/416.05 |
| 6,065,585 | A | * | 5/2000 | Bryant et al. .............. 198/347.1 |

(Continued)

FOREIGN PATENT DOCUMENTS

CN 1837841 9/2006

(Continued)

OTHER PUBLICATIONS

Chinese Office Action dated Jan. 12, 2011 and English translation.

*Primary Examiner* — Huy Q Phan
*Assistant Examiner* — Lamarr Brown
(74) *Attorney, Agent, or Firm* — BainwoodHuang

(57) ABSTRACT

In a side-docking type test handler, a descending mechanism lowers a horizontally postured test tray, which has been transferred into a soak chamber, down to a descent finish position and a vertical posture changing mechanism changes the posture of the test tray, which has been lowered to the descent finish position, from the horizontal state to a vertical state, to transfer the test tray into a test chamber. Further, a horizontal posture changing mechanism changes the posture of the test tray in the test chamber from the vertical state to the horizontal state while transferring the test tray to an ascent start position in a desoak chamber.

5 Claims, 17 Drawing Sheets

U.S. PATENT DOCUMENTS

| | | | |
|---|---|---|---|
| 6,227,347 B1 * | 5/2001 | Bryant et al. | 198/430 |
| 6,498,472 B1 | 12/2002 | Lee et al. | |
| 6,518,745 B2 * | 2/2003 | Kim et al. | 324/750.13 |
| 6,520,312 B2 * | 2/2003 | Jager | 198/346.1 |
| 6,844,717 B2 * | 1/2005 | Shim et al. | 324/750.13 |
| 7,495,463 B2 * | 2/2009 | An et al. | 324/757.01 |
| 7,554,349 B2 * | 6/2009 | Kang et al. | 324/750.03 |
| 7,723,981 B2 * | 5/2010 | Shim et al. | 324/750.04 |
| 8,013,620 B2 * | 9/2011 | Shim et al. | 324/750.13 |
| 2002/0175045 A1 * | 11/2002 | Sjogren | 198/426 |
| 2003/0085160 A1 * | 5/2003 | Shim et al. | 209/573 |
| 2007/0152655 A1 * | 7/2007 | Ham et al. | 324/158.1 |
| 2007/0182437 A1 * | 8/2007 | Shim et al. | 324/765 |
| 2007/0236235 A1 * | 10/2007 | Kang et al. | 324/760 |
| 2008/0131239 A1 * | 6/2008 | Rebstock | 414/225.01 |
| 2009/0148257 A1 * | 6/2009 | Shim et al. | 414/222.02 |
| 2009/0196719 A1 * | 8/2009 | Na et al. | 414/225.01 |
| 2010/0001753 A1 * | 1/2010 | Shim et al. | 324/765 |

FOREIGN PATENT DOCUMENTS

| | | |
|---|---|---|
| KR | 1997-0077466 | 12/1997 |
| KR | 10-0194326 | 2/1999 |
| KR | 10-2003-0029266 | 4/2003 |
| KR | 10-2007-0074262 | 7/2007 |

* cited by examiner

SIDE-DOCKING TYPE TEST HANDLER AND APPARATUS FOR TRANSFERRING TEST TRAY FOR SAME

This application is a Continuation Application of PCT International Application No. PCT/KR2007/004635 filed on Sep. 21, 2007, which designated the United States.

FIELD OF THE INVENTION

The present invention relates to a side-docking type test handler; and, more particularly, to a technique for transferring a test tray in a soak chamber or a desoak chamber of the side-docking type test handler.

BACKGROUND OF THE INVENTION

A test handler is an apparatus for assisting a tester to test semiconductor devices fabricated through a manufacturing process. The test handler classifies the semiconductor devices into several classes according to their test results and loads those classified devices into customer trays.

FIG. 1 is a conceptual plan view of a general test handler 100 including a test handler in accordance with the present invention. The test handler 100 includes a loading unit 110, a soak chamber 120, a test chamber 130, a desoak chamber 140, an unloading unit 150, and so forth.

The loading unit 110 loads untested semiconductor devices in a customer tray into a test tray which is waiting at a loading position LP.

Then, in the soak chamber 120, the semiconductor devices loaded in the test tray transferred from the loading position LP are pre-heated or pre-cooled under test environment conditions before they are transferred to the test chamber 130 to be tested therein. In general, the semiconductor devices are used in various temperature environments. Thus, a test needs to be conducted to investigate whether the semiconductor devices are usable in such various temperature environment conditions. In the soak chamber 120, the semiconductor devices are pre-heated or pre-cooled to be subject to such various environment conditions. The pre-heating or pre-cooling in the soak chamber 120 is carried out while the test tray is being transferred toward the test chamber 130.

In the test chamber 130, the test tray, which has been transferred to a test position TP after being pre-heated or pre-cooled in the soak chamber 120, is brought into close contact with a tester 21 docked (coupled) to the test chamber 130, whereby the semiconductor devices loaded in the test tray are supplied to the tester 21 (more specifically, the semiconductor devices are brought into contact with contact sockets of the tester) so that the test can be carried out. Inside the test chamber 130, a temperature environment in accordance with test conditions is created.

In the desoak chamber 140, the pre-heated or pre-cooled semiconductor devices, which have been transferred from the test chamber 130 while being loaded in the test tray, are allowed to recover their temperatures.

The unloading unit 150 classifies the tested semiconductor devices in the test tray, which has been transferred from the desoak chamber 140 to an unloading position UP, into several classes depending on their test results and unloads them into customer trays.

As described above, the semiconductor devices are transferred through a path from the loading position LP to the unloading position UP via the soak chamber 120, the test position TP in the test chamber 130, and the desoak chamber 130, as indicated by an arrow "a". The transfer of the semiconductor devices from the loading position LP to the unloading position UP is carried out while the semiconductor devices are loaded in the test tray, as described above.

Accordingly, the test tray also needs to be transferred through a circulation path, as indicated by an arrow "b", along which the test tray starting from the loading position LP returns back to the loading position LP after passing through the soak chamber 120, the test position TP in the test chamber 130, the desoak chamber 140, and the unloading position UP.

The test handler 100 having the aforementioned basic circulation paths can be classified into two types depending on how the semiconductor devices loaded in the test tray are brought into contact with the contact sockets of the tester: one is an under head docking type and the other is a side-docking type. A side-docking type test handler allows the semiconductor devices loaded in the test tray to contact with the contact sockets while keeping the test tray vertically. Accordingly, in the side-docking type test handler, a process for changing the posture of the test tray from a horizontal state to a vertical state needs to be conducted after the loading of the semiconductor devices is completed, and a process for changing the posture of the test tray from the vertical state to the horizontal state is required after the test of the semiconductor devices is completed.

Korean Patent Laid-open Publication No. 1999-0077466 (Reference Document), entitled "Method for transferring a test tray in a horizontal type test handler", discloses a technique related to a circulation path of a test tray in a side-docking type test handler.

The method for transferring the test tray disclosed in the Reference Document includes the steps of: changing the posture of the test tray loaded with semiconductor devices to a vertical state before the test tray is transferred into a soak chamber (in the Reference Document, the soak chamber is defined as a heating chamber); transferring the test tray into the soak chamber while keeping the test tray vertically; heating the semiconductor devices under test conditions while transferring the test tray step by step inside the soak chamber; supplying the heated test tray to a test unit while keeping the test tray vertically; transferring the test tray into a desoak chamber (in the Reference Document, the desoak chamber is defined as a cooling chamber) while keeping the test tray vertically after the test of the semiconductor devices is completed; cooling the semiconductor devices to an exterior temperature while transferring the test tray step by step inside the desoak chamber; extracting the vertically postured test tray from the desoak chamber and changing the posture of the test tray from the vertical state to a horizontal state; transferring the horizontally postured test tray to an unloading position; and transferring the test tray to a loading position horizontally after the semiconductor devices are unloaded.

In the Reference Document, the posture of the test tray loaded with the semiconductor devices is changed to the vertical state before the test tray is transferred to the soak chamber and then the vertically postured test tray is transferred into the soak chamber; and, inside the soak chamber 120, the test tray is transferred toward the test chamber while keeping the test tray vertically. However, such a method has problems as follows.

First, the circulation path disclosed in the Reference Document requires a step of transferring the test tray, which has been loaded with the semiconductor devices, to a position above the soak chamber and a step of transferring the vertically postured test tray from the inside of the desoak chamber to a position above the desoak chamber are additionally employed. However, these steps require additional time which is irrelevant to the process of heating or cooling the semiconductor devices under test environment conditions to maintain them suitable for test conditions or the process of recovering the temperature of the semiconductor devices. Thus, the efficiency of processing the semiconductor devices is deteriorated as much as the time required for these additional steps.

Second, the time required for changing the posture of the test tray to the vertical state or to the horizontal state is also irrelevant to the process of heating or cooling the semiconductor devices in the test environments to maintain them suitable for the test conditions or the process of recovering the temperature of the semiconductor devices. Thus, the posture changing step results in a deterioration of the processing efficiency.

Third, in the Reference Document, since test tray is transferred step by step inside the soak chamber and the desoak chamber while they are kept vertically, the soak chamber and the desoak chamber need to have sufficient forward-backward lengths in order to obtain sufficient time during which the semiconductor devices loaded in the test tray are heated or cooled or the temperature of the semiconductor devices is recovered. Therefore, the forward-backward length of the test handler is lengthened, resulting in an increase of the entire apparatus size.

Fourth, in accordance with the Reference Document, since the test tray loaded with the semiconductor devices is transferred in the soak chamber and the desoak chamber while it is kept vertically, a transfer path along which the test tray is moved in the vertical state is lengthened. In general, if such transfer path is long, there is a high likelihood that the semiconductor devices loaded in the test tray are separated from the test trays or deviated from their set positions inside the test tray.

SUMMARY OF THE INVENTION

It is, therefore, an object of the present invention to provide a technique for allowing a posture change of a test tray inside a soak chamber or a desoak chamber, while allowing the test tray to be conveyed in a horizontal state inside the soak chamber or the desoak chamber.

In accordance with an aspect of the present invention, there is provided a side-docking type test handler including: a loading unit for loading untested semiconductor devices into a test tray which is at a loading position; a soak chamber for per-heating or pre-cooling the semiconductor devices loaded in the test tray transferred from the loading position in a horizontal state; a test chamber for allowing the untested semiconductor devices, which are loaded in the test tray transferred from the soak chamber, to be tested therein; a desoak chamber for recovering the temperature of the semiconductor devices loaded in the test tray transferred from the test chamber; an unloading unit for unloading the semiconductor devices, which are loaded in the test tray transferred from the desoak chamber to an unloading position, into customer trays while classifying the tested semiconductor devices into several classes depending on test results; a descending mechanism for lowering the horizontally postured test tray, which has been transferred into the soak chamber, down to a descent finish position; a vertical posture changing mechanism for changing the posture of the test tray, which has been lowered to the descent finish position, from the horizontal state to a vertical state, to transfer the test tray into the test chamber; and a horizontal posture changing mechanism for changing the posture of the test tray from the vertical state to the horizontal state before the test tray is transferred to the unloading position.

Preferably, the vertical posture changing mechanism transfers the test tray, which has been lowered to the descent finish position, into the test chamber while changing the posture of the test tray to the vertical state.

Preferably, the test handler further includes an ascending mechanism for raising the test tray, which is horizontally located at an ascent start position inside the desoak chamber, up to an ascent finish position, wherein the horizontal posture changing mechanism transfers the test tray, which has been transferred from the test chamber, to the ascent start position while changing the posture of the test tray to the horizontal state.

In accordance with another aspect of the present invention, there is provided a side-docking type test handler including: a loading unit for loading untested semiconductor devices into a test tray which is at a loading position; a soak chamber for per-heating or pre-cooling the semiconductor devices loaded in the test tray transferred from the loading position in a horizontal state; a test chamber for allowing the untested semiconductor devices, which are loaded in the test tray transferred from the soak chamber, to be tested therein; a desoak chamber for recovering the temperature of the semiconductor devices loaded in the test tray transferred from the test chamber; an unloading unit for unloading the semiconductor devices, which are loaded in the test tray transferred from the desoak chamber to an unloading position, into customer trays while classifying the tested semiconductor devices into several classes depending on test results; a vertical posture changing mechanism for changing the posture of the test tray from the horizontal state to a vertical state for transferring the test tray into the test chamber; a horizontal posture changing mechanism for transferring the test tray, which has been transferred from the test chamber, to an ascent start position while changing the posture of the test tray to the horizontal state; and an ascending mechanism for raising the horizontally postured test tray, which has been transferred to the ascent start position by the vertical posture changing mechanism, up to an ascent finish position inside the desoak chamber.

In accordance with still another aspect of the present invention, there is provided a test tray transferring apparatus for use in a side-docking type test handler, including: a descending mechanism for lowering a test tray in a horizontal state from a descent start position down to a descent finish position; and a vertical posture changing mechanism for changing the posture of the test tray, which has been lowered to the descent finish position, from the horizontal state to a vertical state.

Preferably, the vertical posture changing mechanism includes: a grip member for holding or releasing the test tray; and a rotation lever of which one end is connected to the grip member while the other end thereof is rotatably fixed, wherein the rotation lever can be rotated within an angular range of 90 degrees.

Preferably, the descending mechanism includes: a pair of endless track bodies spaced away from each other by a distance to sustain the test tray therebetween, each of the endless track bodies having an endless member rotated around the descent start position and the descent finish position by a driving source; and a number of holders connected to the endless members of the endless track bodies at regular intervals, for holding the test tray in the horizontal state thereon. In this case, the endless member may be a belt or a chain.

In accordance with still another aspect of the present invention, there is provided a test tray transferring apparatus for use in a side-docking type test handler, including: a horizontal posture changing mechanism for transferring a test tray to an ascent start position while changing the posture of the test tray from a vertical state to a horizontal state; and an ascending mechanism for raising the test tray, which has been transferred to the ascent start position by the horizontal posture changing mechanism, up to an ascent finish position.

Preferably, the horizontal posture changing mechanism includes: a grip member for holding or releasing the test tray; and a rotation lever of which one end is connected to the grip member while the other end thereof is rotatably fixed, wherein the rotation lever can be rotated within an angular range of 90 degrees.

Preferably, the ascending mechanism includes: a pair of endless track bodies spaced away from each other by a distance to sustain the test tray therebetween, each of the endless track bodies having an endless member rotated around the ascent start position and the ascent finish position by a driving source; and a number of holders connected to the endless members of the endless track bodies at regular intervals, for holding the test tray in the horizontal state thereon. In this case, the endless member may be a belt or a chain.

In accordance with still another aspect of the present invention, there is provided a method for transferring test trays in a side-docking type test handler, including: (a) transferring a test tray in a horizontal state from a loading position into a test chamber via a soak chamber after semiconductor devices are loaded completely thereon, wherein the posture of the test tray is changed from the horizontal state to a vertical state at a point while it is transferred; (b) after the completion of a test of semiconductor devices loaded in the test tray transferred into the test chamber, transferring the test tray to an ascent start position inside a desoak chamber while changing the posture of the test tray from the vertical state to the horizontal state; (c) raising the test tray from the ascent start position to an ascent finish position inside the desoak chamber; (d) transferring the test tray from the ascent finish position to an unloading position; and (e) transferring the test tray from the unloading position to the loading position after the semiconductor devices are unloaded completely therefrom.

In accordance with the present invention as described above, following effects can be obtained.

First, since additional points, which are irrelevant to the process of pre-heating/pre-cooling the test tray or recovering the temperature of the semiconductor devices, are not added to the basic circulation path of the test tray, the processing efficiency of the test hander can be increased.

Second, since the process for changing the posture of the test tray to the vertical state or to the vertical state is performed in the soak chamber or the desoak chamber, the time required for these posture changes of the test tray is included in the time taken to heat or cool the semiconductor devices under test environments to thereby set them suitable for test conditions or to recover their temperature. Therefore, the processing efficiency of the test handler can be improved.

Third, the forward-backward length of the soak chamber or the desoak chamber needs to be increased slightly just enough to accommodate the horizontal postured test tray and the pair of endless track bodies therein. Therefore, the size of the apparatus can be minimized.

Fourth, since the time period during which the test tray loaded with the semiconductor devices are maintained vertically in the soak chamber or the desoak chamber is omitted, the likelihood that the semiconductor devices are separated from the test tray can be reduced.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Hereinafter, a side-docking type test handler in accordance with embodiments of the present invention will be described in detail with reference to the accompanying drawings.

(Process in Soak Chamber 120)

Figure 1:
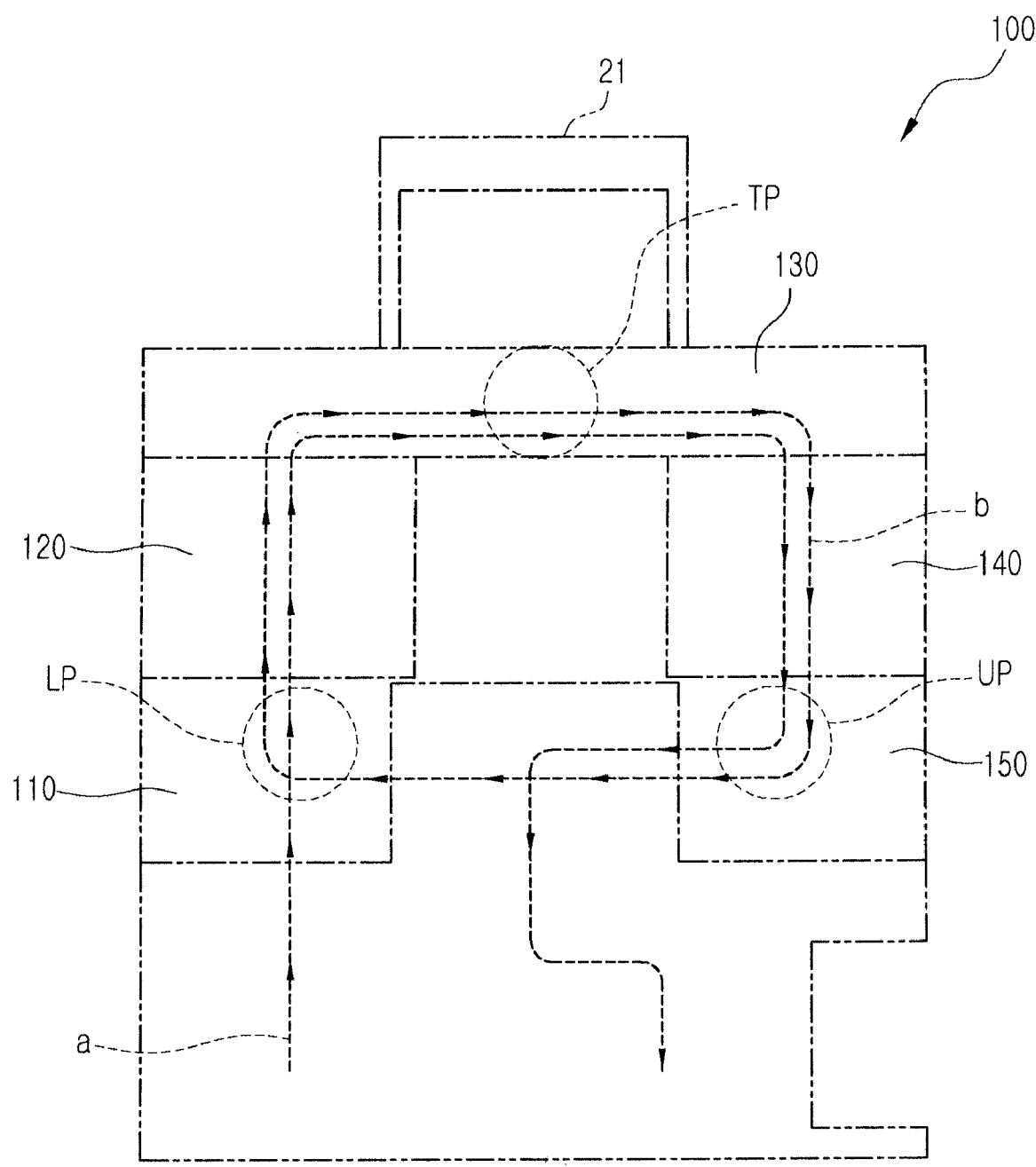
FIG. 1 is a plan view for describing transfer paths of semiconductor devices and test trays in a general test handler (including a test handler in accordance with the present invention)
Figure 2:
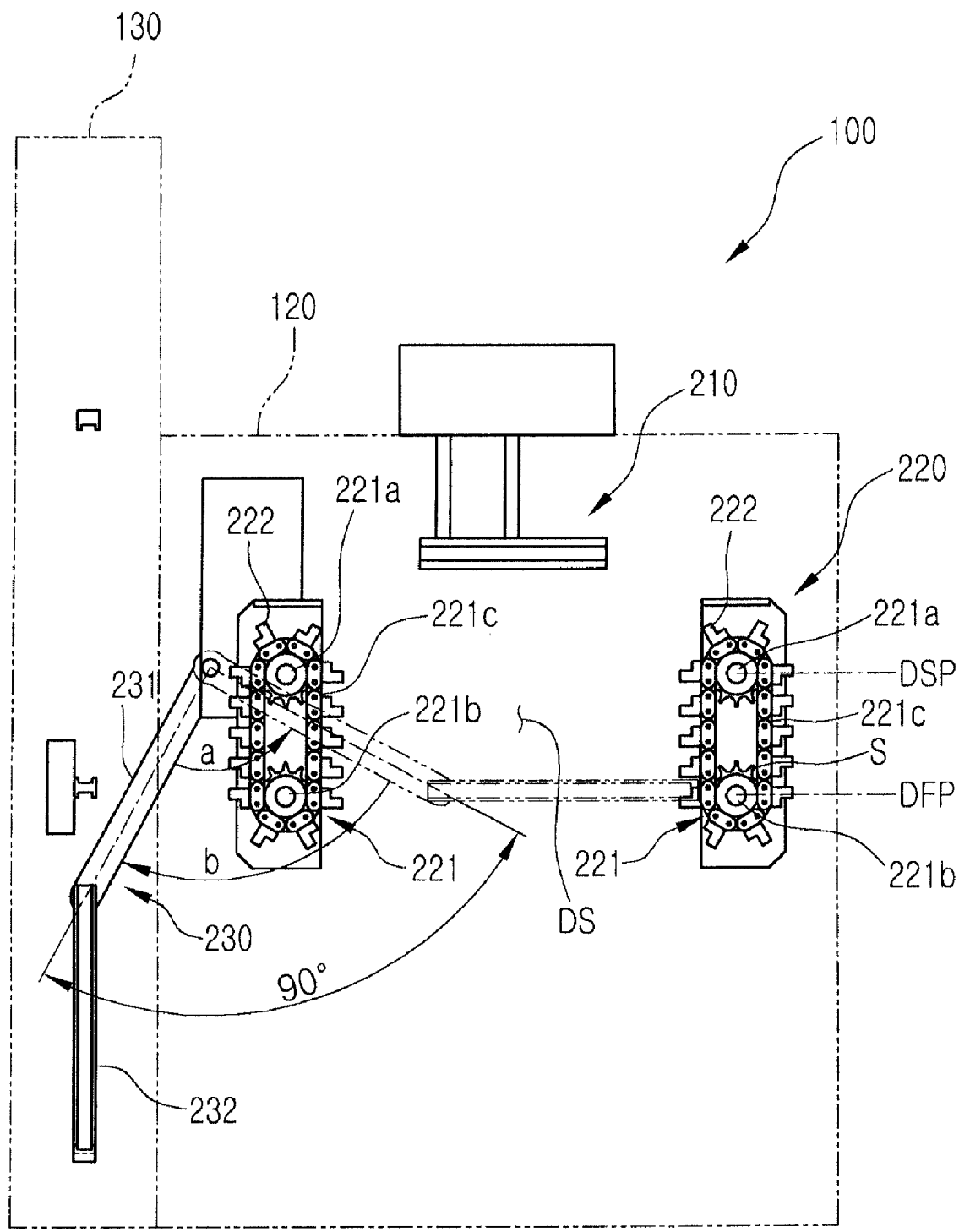
FIG. 2 sets forth a schematic cross sectional view of a test handler in accordance with an embodiment of the present invention, which shows a left side of the test hander where a soak chamber is located.
Figure 3:
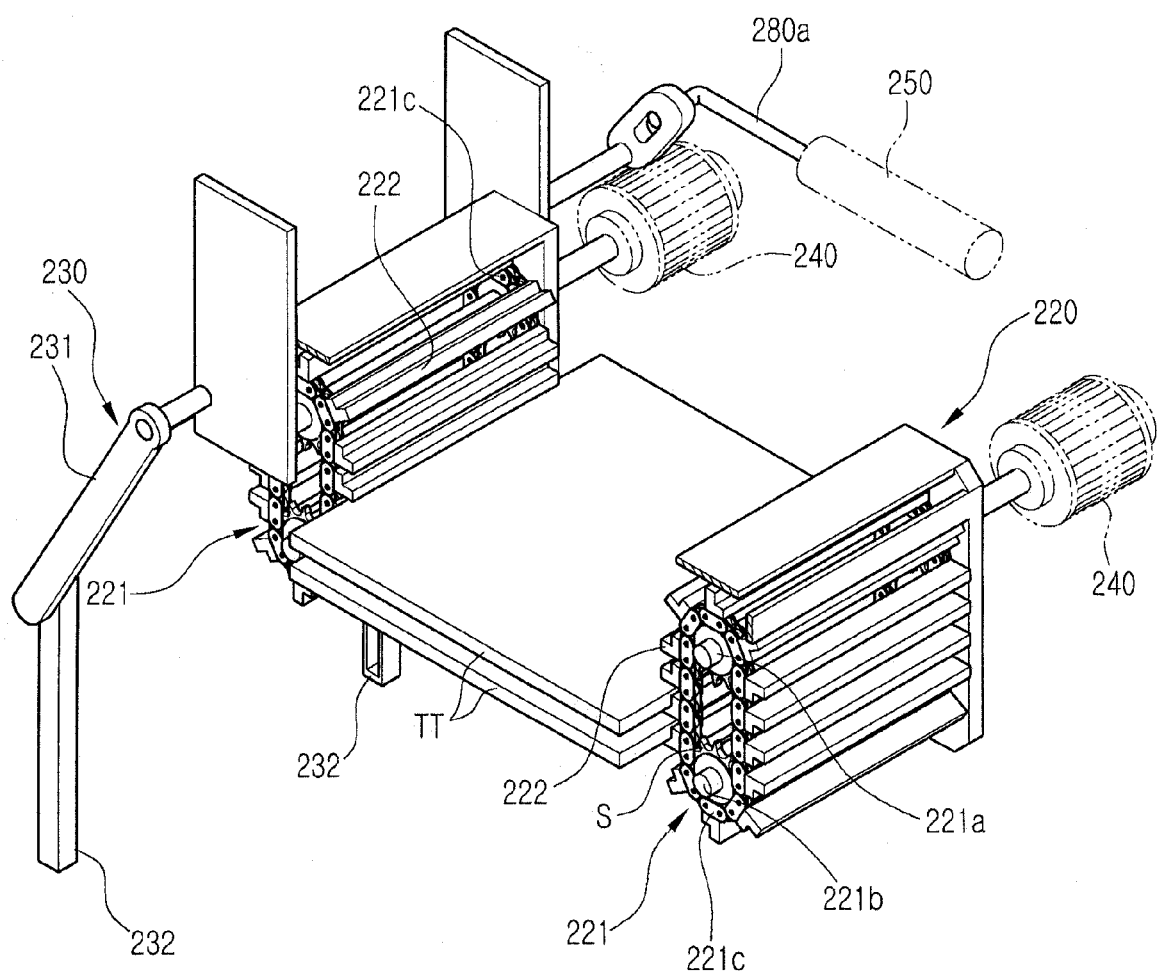
FIG. 3 presents a perspective view showing major parts of FIG. 2.

FIG. 2 is a cross sectional view of a test handler 100 in accordance with an embodiment of the present invention, which shows a left side of the test handler 100 where a soak chamber 120 is located. FIG. 3 is a perspective view showing major parts of FIG. 2.

As shown in FIG. 2, incorporated in the soak chamber 120 of the test handler 100 are a tray settling mechanism 210, a descending mechanism 220, a vertical posture changing mechanism 230, and so forth.

The tray settling mechanism 210 holds a test tray TT transferred from a loading position LP and provides it to a descent start position DSP from which a descent of the test tray TT is begun by the descending mechanism 220.

The descending mechanism 220 lowers the test tray from the descent start position DSP down to a descent finish position DFP. For the purpose, the descending mechanism 220 includes a pair of endless track bodies 221 and a number of holders 222.

The endless track bodies 221 are spaced away from each other by a specific forward-backward distance to hold and sustain the test tray therebetween horizontally. Each of the pair of the endless track bodies 221 includes a driving roller 221a rotatably fixed at the descent start position DSP and rotated by a motor 240; a driven roller 221b rotatably fixed at the descent finish position DFP; and a pair of chains 221c, a pair of endless members, wound around the driving roller 221a and the driven roller 221b. Here, the pair of chains 221c are engaged with sprockets S provided at both ends of the driving roller 221a and the driven roller 221b such that they can be rotated therearound. Here, the chains 221c can be replaced by belts or the like. Further, though, in FIG. 3, a pair of motors 240 for driving the respective endless track bodies 221 are provided for the simplicity of explanation, it is also possible to set up that the pair of endless track bodies 221 are rotated by a single motor. In this case, a gear train for rotating the two chains in opposite directions is additionally required.

The holders 222 are connected to the pair of chains 221c provided at each of the endless track bodies 221 at regular intervals. The holders 222 of one endless track body 221 are protruded to face those of the other endless track body 221 in a descent space DS to hold the test tray TT which is being descended in the horizontal state. Accordingly, as the chains 221c are rotated, the holders 222 are also rotated.

Referring to FIGS. 2 and 3, the vertical posture changing mechanism 230 includes a rotation lever 231, a grip member 232, and so forth. One end, which is rotatable by a cylinder 250 (which can be replaced by a motor), of the rotation lever 231 is rotatably fixed and the other end of the rotation lever 231 is extended downward. The grip member 232 is installed at the other end of the rotation lever 231 and serves to hold or release the test tray. Here, the rotation lever 231 is reciprocatingly rotated within an angular range of, e.g., 90 degrees as shown in FIG. 2, as the piston rod 250a of the cylinder 250 moves forward and backward. When the rotation lever 231 completes a counterclockwise rotation (in a direction marked by an arrow "a" in FIG. 2) (hereinafter, referred to as a "reverse rotation", the grip member 232 comes to position where it can grip the test tray horizontally sustained at the descent finish position DFP. When the rotation lever 231 completes a clockwise rotation (in a direction marked by an arrow "b" of FIG. 2) (hereinafter, referred to as a "forward rotation", the test tray gripped by the grip member 232 is allowed to be located in the test chamber 130 with its posture changed to a vertical state.

Now, the process performed in the soak chamber 120 of the test handler 100 having the above-described configuration will be explained.

Figure 4:
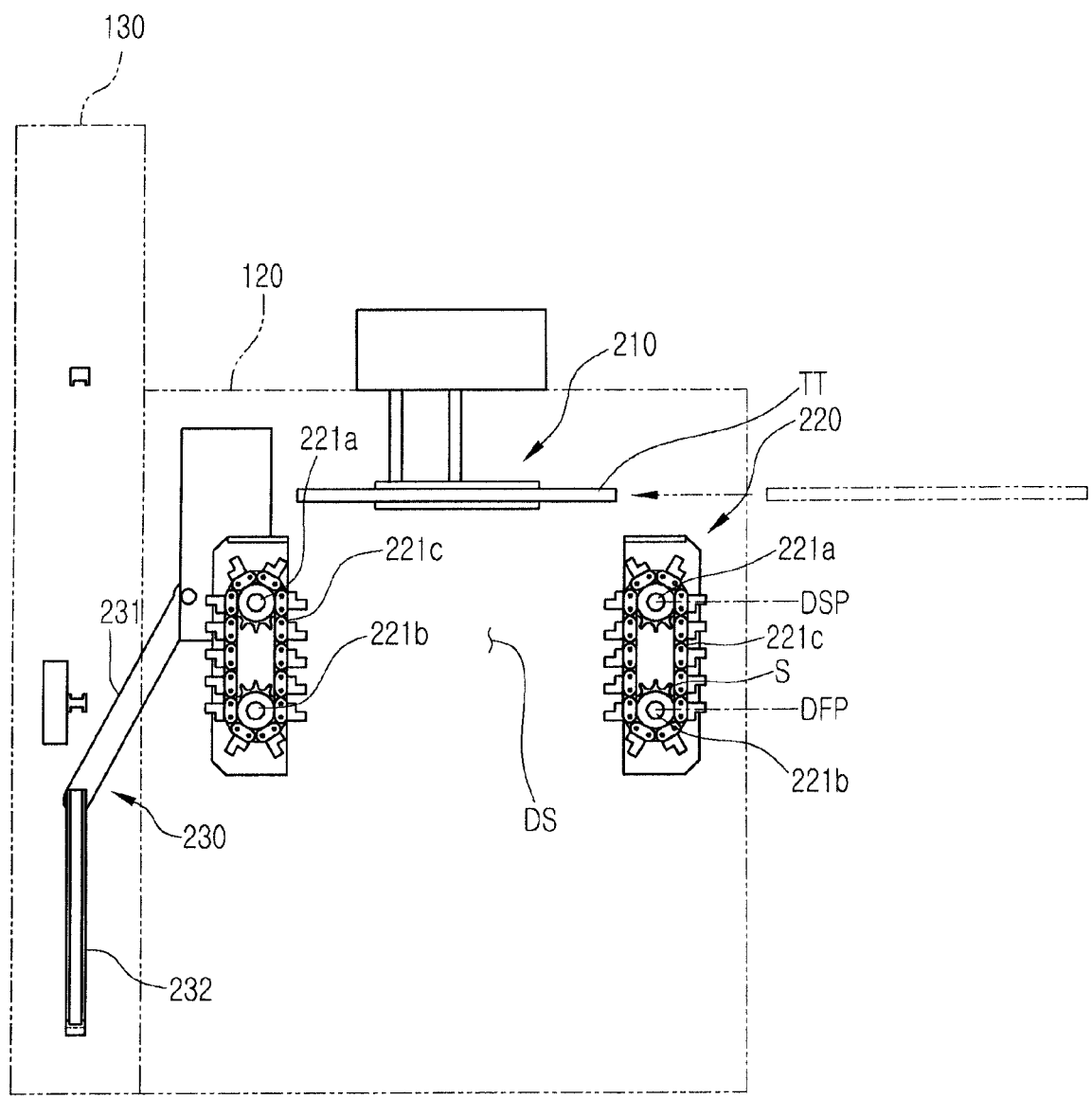
FIGS. 4 to 9 provide schematic diagrams for describing a test tray transferring process carried out in the soak chamber of the test handler in accordance with the embodiment of the present invention.
Figure 5:
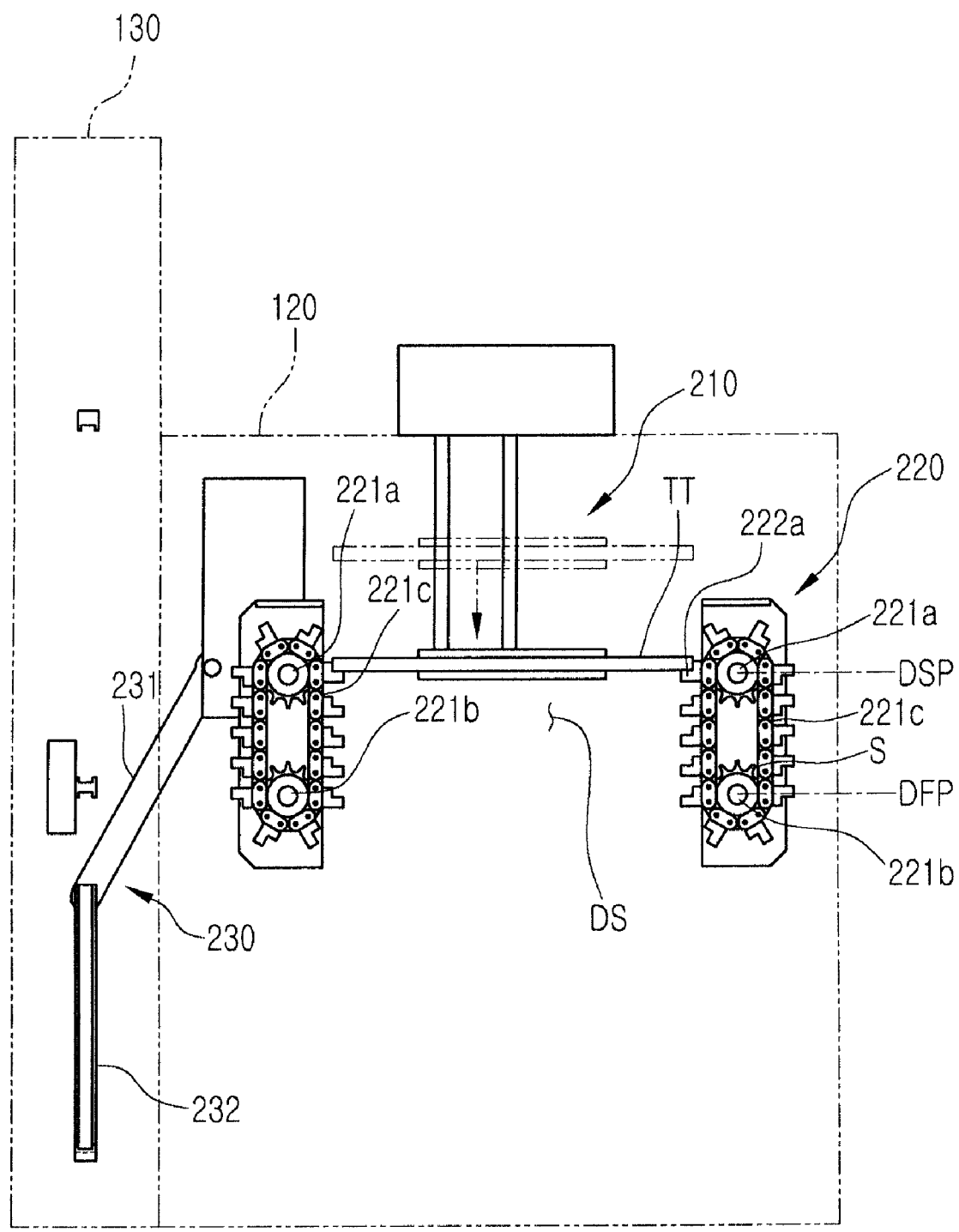

As shown in FIG. 4, if a test tray TT is transferred into the soak chamber 120 from a loading position by a pusher (not shown) (as indicated by an arrow in FIG. 4), the tray settling mechanism 210 holds the test tray TT and moves it down to the descent start position DSP (as indicated by an arrow in FIG. 5) and mounts the test tray TT on the holders 222a which are located at the descent start position DSP, as shown in FIG. 5.

Figure 6:
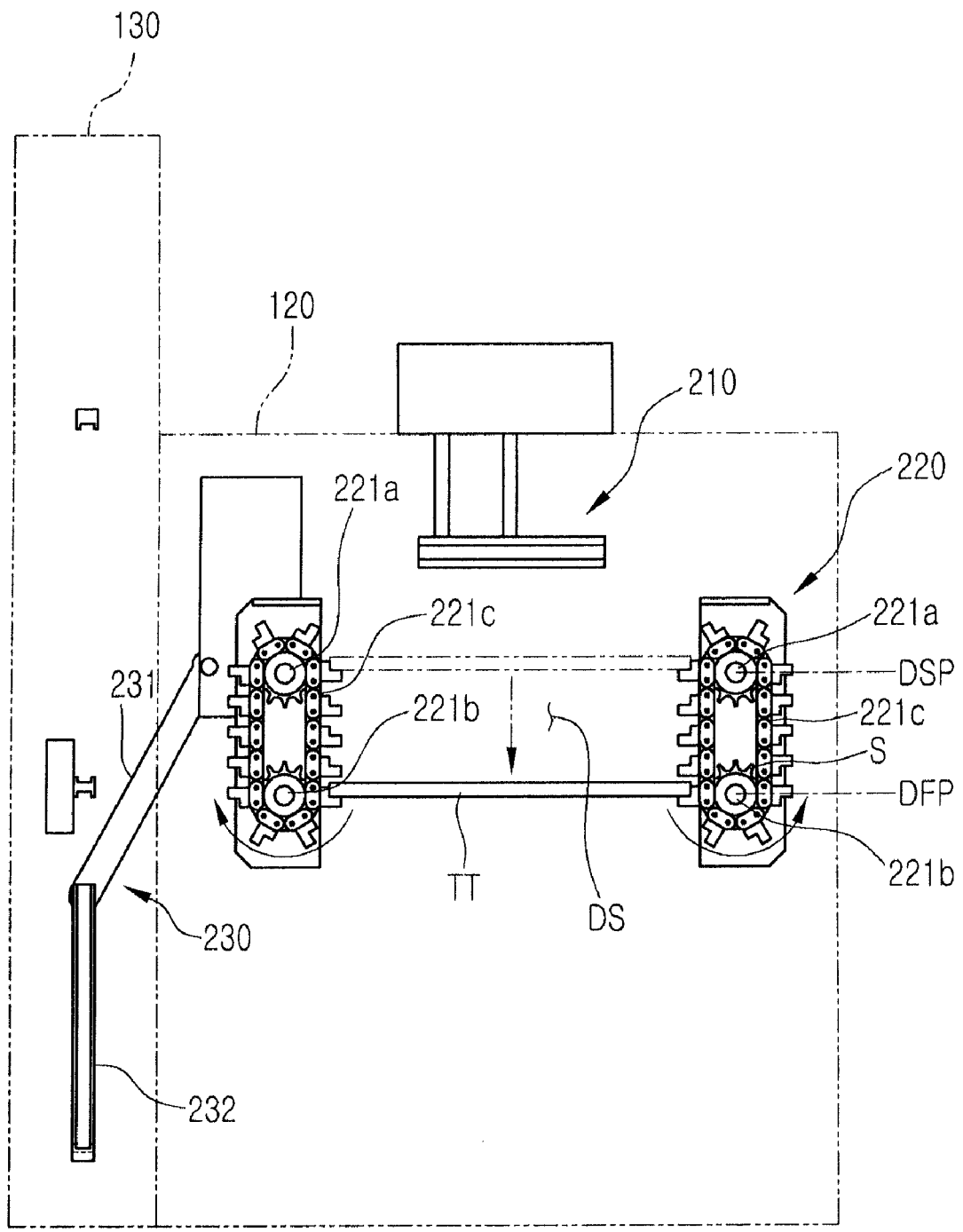

Subsequently, the motor 240 is operated to rotate the driving roller 221a, the driven roller 221b, and the chains 221c (as indicated by solid-line arrows in FIG. 6), whereby the test tray TT is lowered down to the descent finish position DFP (as indicated by dotted-line arrows in FIG. 6). Here, the chains 221c can be rotated step by step to descend the horizontally postured test tray TT to the descent finish position DFP step by step or the chains 221c can be rotated continuously to descend the test tray TT to the descent finish position DFP straightly. The selection of either one of these gradual or continual operations can be made depending on test circumferences recognized by a controller (not shown). While the test tray TT is moving down, semiconductor devices loaded in the test tray TT are subjected to the internal environment of the soak chamber 120, so they are pre-heated or pre-cooled.

Figure 7:
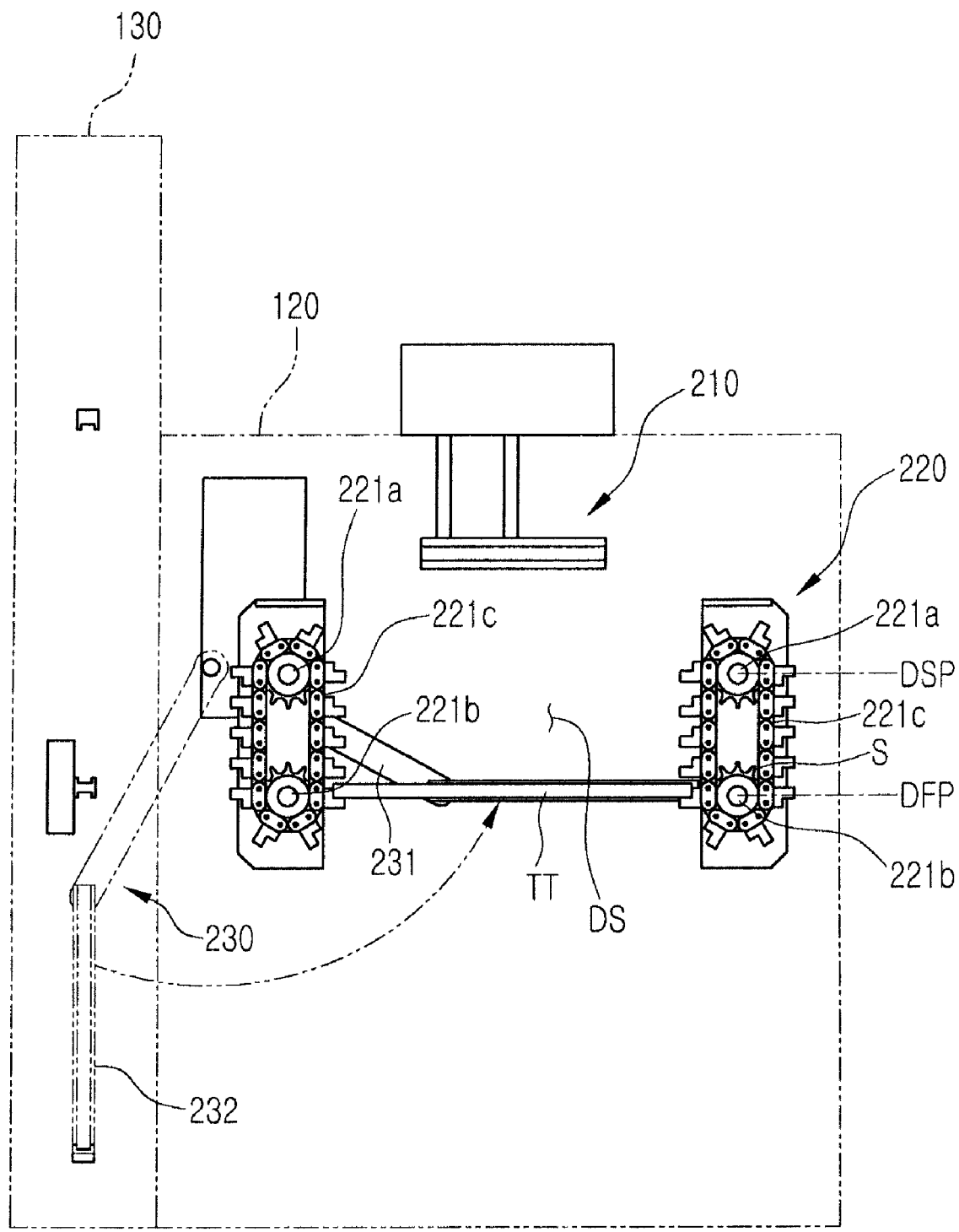

If the test tray TT in the horizontal state reaches the descent finish position DFP, the piston rod 250a of the cylinder 250 moves forward, whereby the rotation lever 231 is rotated reversely (as indicated by an arrow in FIG. 7), and the grip member 232 is allowed to grip the test tray TT which is sustained horizontally at the descent finish position DFP, as shown in FIG. 7.

Figure 8:
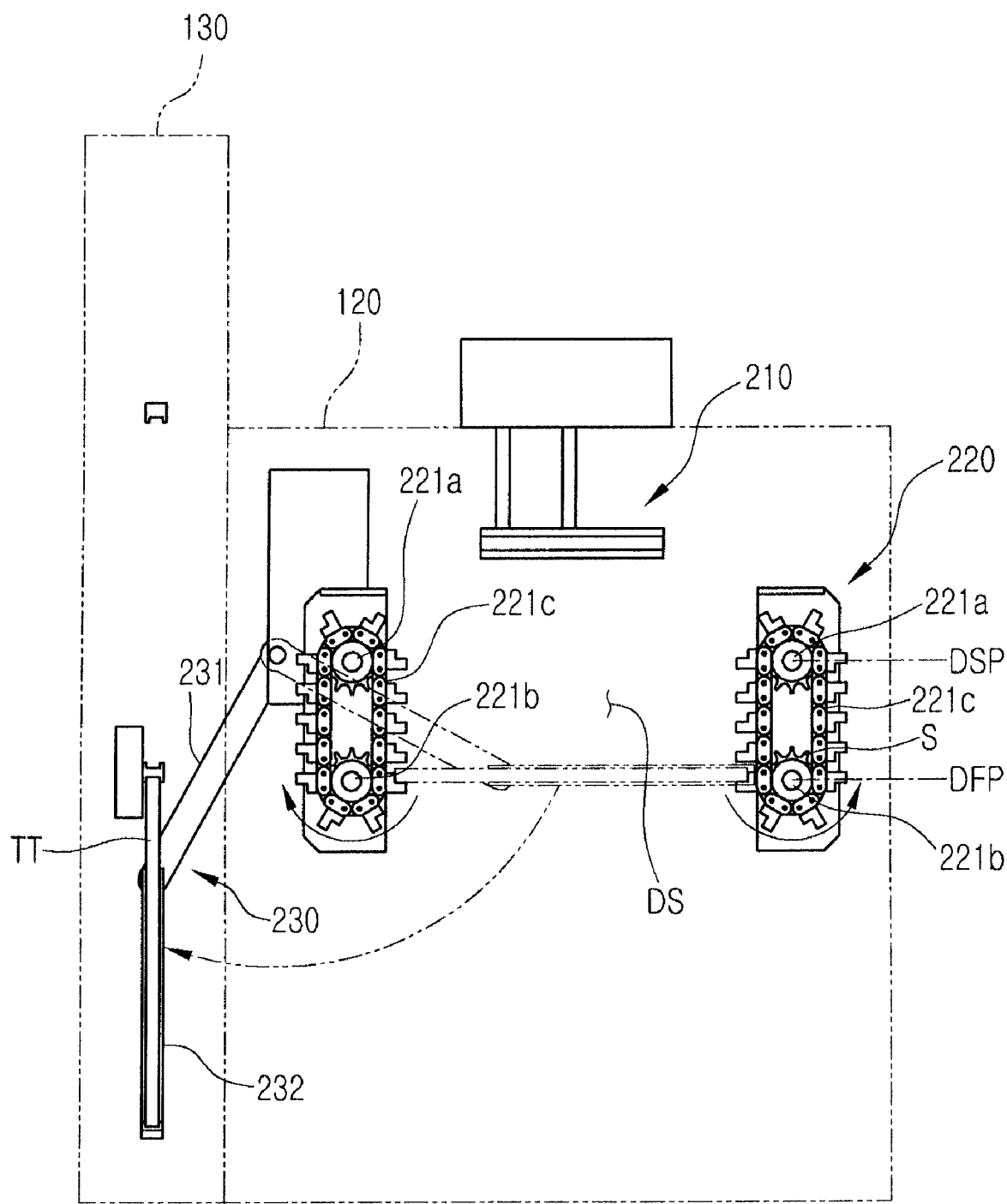

If the grip member 232 grips the horizontally postured test tray TT at the descent finish position DFP, the piston rod 250a of the cylinder 250 then moves backward, whereby the rotation lever 231 is rotated forwardly by 90 degrees (as indicated by an arrow in FIG. 8). By the forward rotation of the rotation lever 231, the test tray TT whose posture is changed from the horizontal state to a vertical state, is located inside the test chamber 130. At this time, the chains 221c are rotated to some degree so that the holders 222 do not hinder the movement and the posture change of the test tray TT. By using this vertical posture changing mechanism 230 in accordance with the embodiment of the present invention, the test tray TT is transferred into the test chamber 130 while its posture is being changed from the horizontal state to the vertical state so that the test tray can be located inside the test chamber in the vertical state. Therefore, the conventional process of transferring the test tray in the vertical state toward the test chamber 130 can be omitted.

Figure 9:
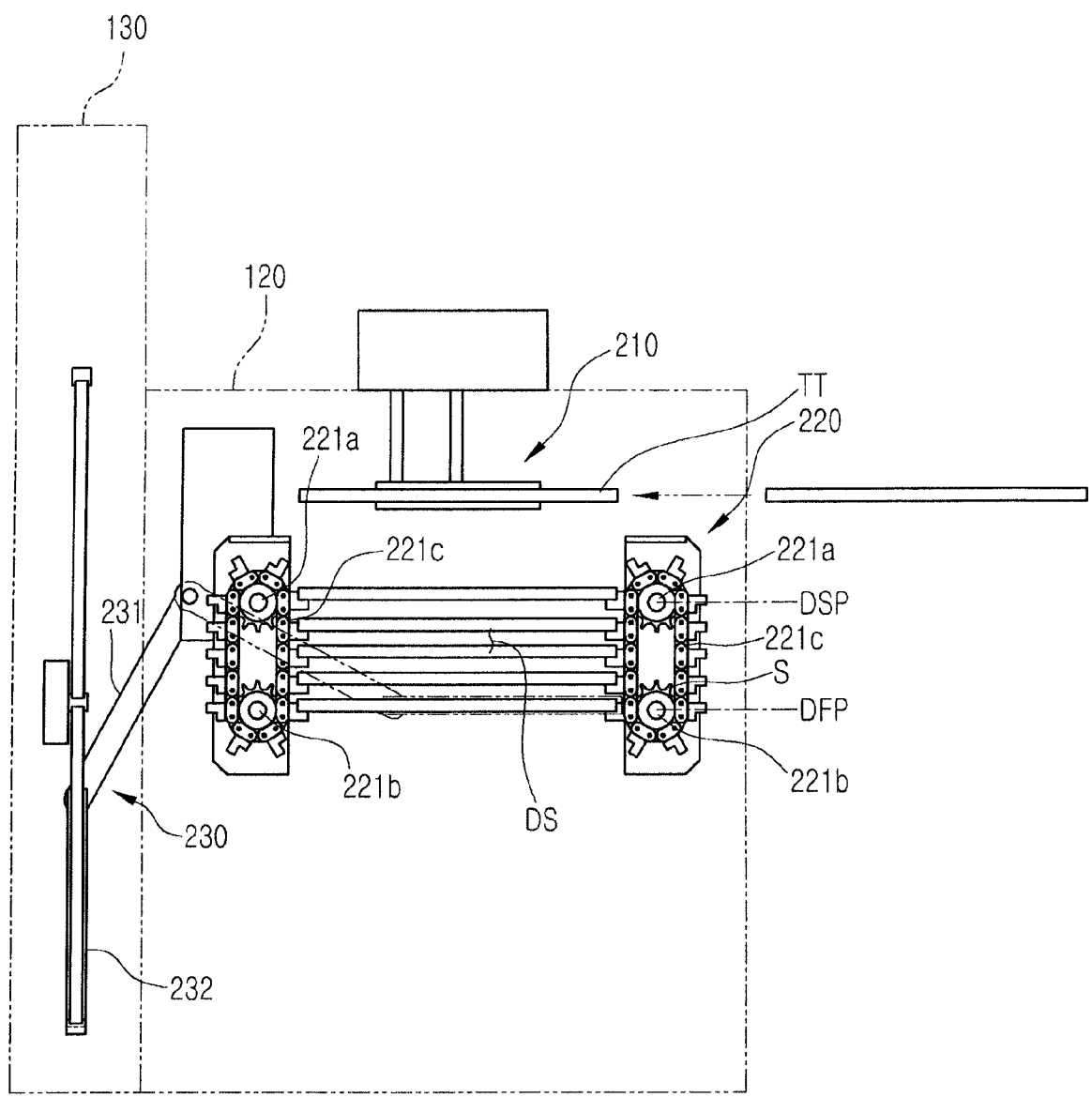

Meanwhile, in an actual process in the test handler 100, a plurality of test trays TT are sequentially circulated in the test handler 100, so that, in the soak chamber 120, the plurality of test trays TT are being moved together in general, as shown in FIG. 9. In case the loading by the loading unit 110 is delayed, however, the test trays TT may not be arranged successively in the transfer path inside the soak chamber 120. In such case, a test tray transferred into the soak chamber 120 at a delayed timing can be set to be straightly descended by way of controlling the descending mechanism as described above if a preceding test tray was already transferred to the test chamber 130.

(Process in Desoak Chamber 140)

In general, a test tray transferring process on the side of the desoak chamber 140 is symmetric with the test tray transferring process on the side of the soak chamber 120. That is, in the soak chamber 120, the test tray TT, which has entered the soak chamber 120 from the loading position LP, is descended and is then transferred to the test chamber 130 while its posture is being changing to the vertical state. However, in the desoak chamber 140, the vertically-postured TT in the test chamber 130 is moved into the desoak chamber 140 while its posture is being changed to the horizontal state, and after the test tray TT is horizontally located in the desoak chamber 140, the test tray TT is raised to be ready for the transfer to the unloading position UP. Accordingly, components of the desoak chamber 140 and their functions are symmetrically identical with those of the soak chamber 120, so a configuration of the desoak chamber 140 will be described hereinafter with reference to FIG. 10 while minimizing redundant description.

Figure 10:
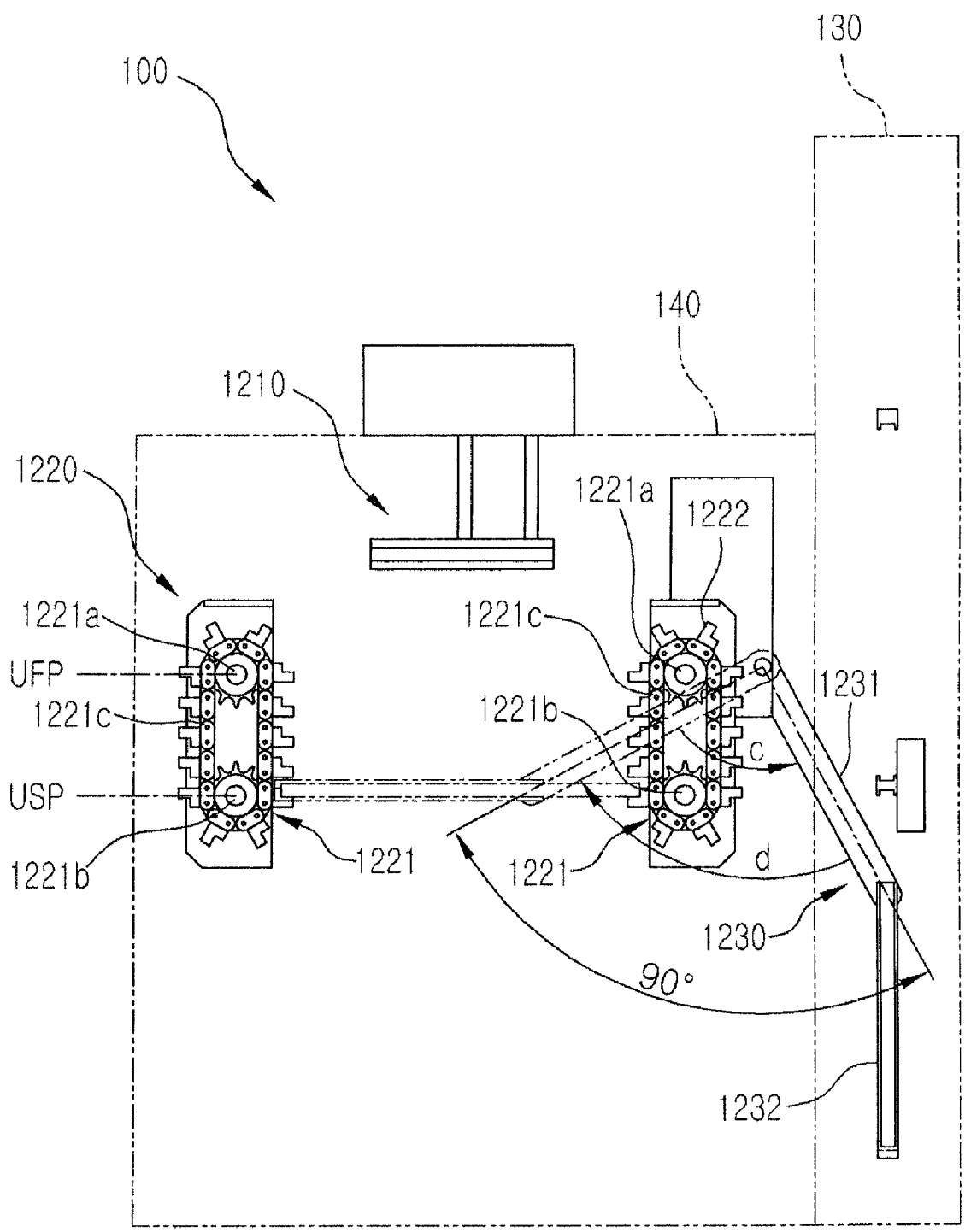
FIG. 10 depicts a schematic cross sectional view of the test handler in accordance with the embodiment of the present invention, which shows a right side of the test hander where a desoak chamber is located.
Figure 11:
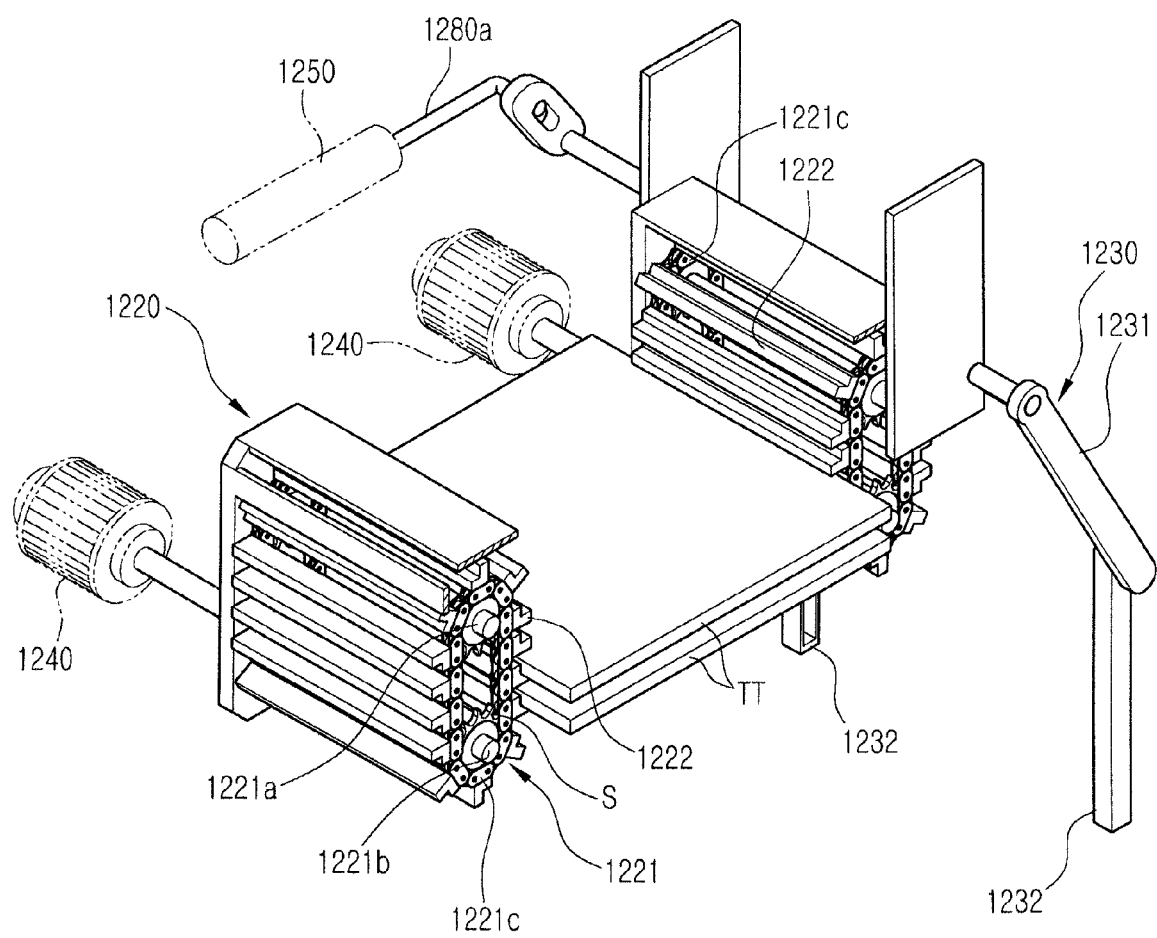
FIG. 11 is a perspective view showing major parts of FIG. 10.

FIG. 10 is a cross sectional view of the test handler 100 in accordance with the present invention, which shows a right side of the test handler 100 where the desoak chamber 140 is located. FIG. 11 is a perspective view showing major components of FIG. 10.

As illustrated in FIG. 10, incorporated in the desoak chamber 140 of the test handler 100 are a horizontal posture changing mechanism 1230, an ascending mechanism 1220, a tray detaching mechanism 1210, and so forth.

The horizontal posture changing mechanism 1230 corresponds to the vertical posture changing mechanism 230 as described above. As shown in FIGS. 10 and 11, the horizontal posture changing mechanism 1230 includes a rotation lever 1231, a grip member 1232, and so forth. One end, which is rotatable by a cylinder 1250, of the rotation lever 1231 is rotatably fixed, and the other end thereof is extended downward. The grip member 1232 is installed at the other end of the rotation lever 1231 and serves to hold or release the test tray. Here, the rotation lever 1231 is reciprocatingly rotated within an angular range of, e.g., 90 degrees as the piston rod 1250a of the cylinder 1250 moves forward and backward. When the rotation lever 1231 completes a counterclockwise rotation (in a direction marked by an arrow "c" in FIG. 10) (hereinafter, referred to as a "reverse rotation", the grip member 1232 comes to a position where it can grip the test tray vertically postured in the test chamber 130. When the rotation lever 1231 completes a clockwise rotation (in a direction marked by an arrow "d" in FIG. 10) (hereinafter, referred to as a "forward rotation", the test tray gripped by the grip member 1232 is allowed to be located at an ascent start position USP inside the desoak chamber 140 with its posture changed to the horizontal state.

The ascending mechanism 1220 corresponds to the descending mechanism 220 in the soak chamber 120. The ascending mechanism 1220 raises the test tray from the ascent start position USP up to an ascent finish position UFP. This ascending mechanism 1220 includes a pair of endless track bodies 1221 and a number of holders 1222, as illustrated in FIGS. 10 and 11.

The two endless track bodies 1221 are spaced away from each other by a certain forward-backward distance to hold and sustain the test tray therebetween horizontally. Each of the pair of the endless track bodies 1221 includes a driving roller 1221b rotatably fixed at the ascent start position USP and rotated by a motor 1240; a driven roller 1221a rotatably fixed at the ascent finish position UFP; and a pair of chains 1221c, a pair of endless members, wound around the driving roller 1221b and the driven roller 1221a.

The holders 1222 are connected to the pair of the chains 1221c provided at each of the endless track bodies 1221 at regular intervals. The holders 1222 of one endless track body 1221 are protruded to face those of the other endless track body 1221 to hold the test TT in the horizontal state.

The tray detaching mechanism 1210 holds the test tray TT raised up to the ascent finish position UFP by the ascending mechanism 1220 and moves it upward to a proper position from which the test tray can be transferred to the unloading position.

Now, the process performed in the desoak chamber 140 of the test handler 100 configured as described above will be explained.

Figure 12:
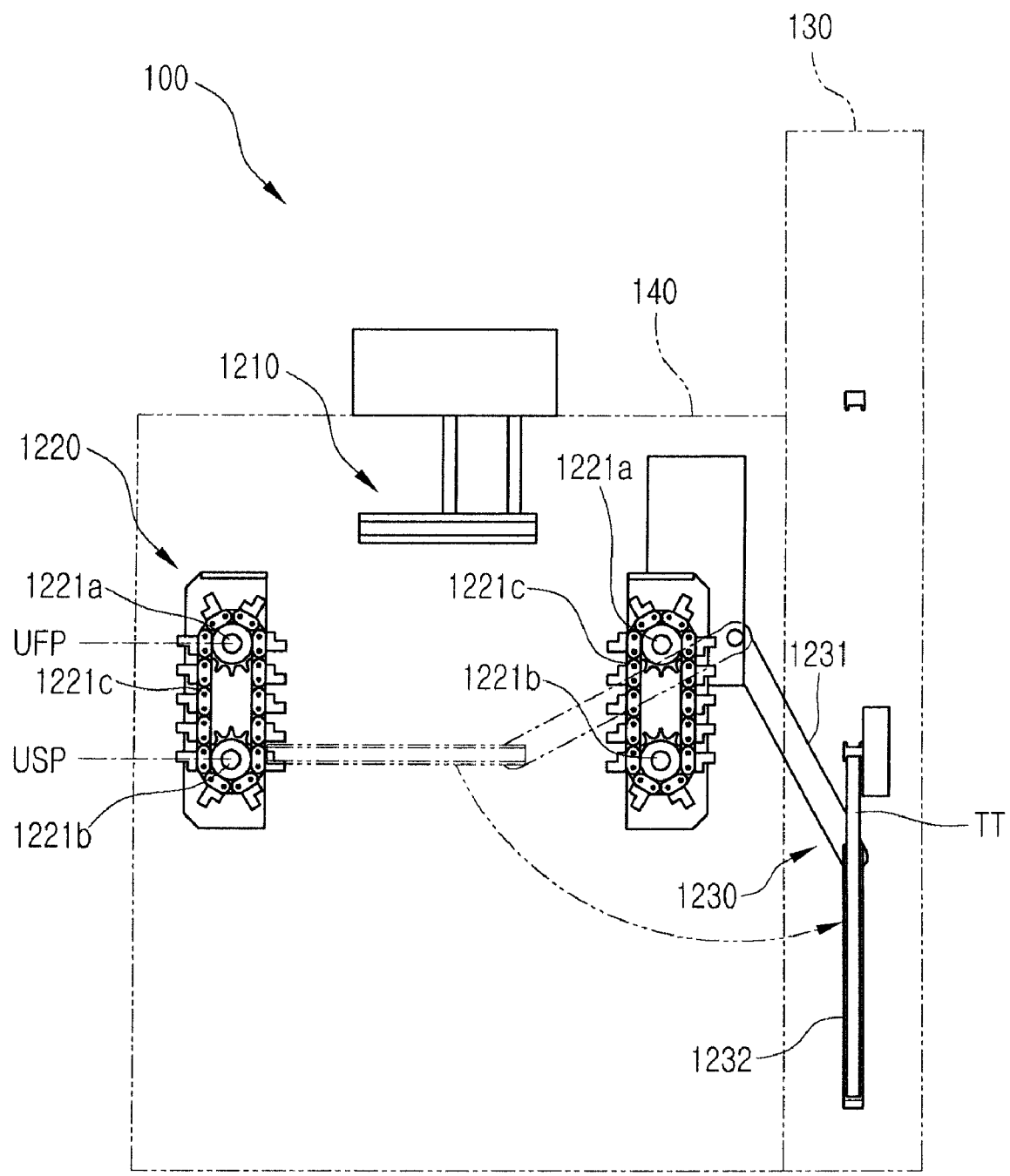
FIGS. 12 to 17 offer schematic diagrams for describing a test tray transferring process carried out in the desoak chamber of the test handler in accordance with the embodiment of the present invention.

If the vertically postured test tray TT loaded with the tested semiconductor devices is transferred to a right side of the test chamber 130, the piston rod 1250a of the cylinder 1250 is moved backward to rotate the rotation lever 1231 reversely (as indicated by an arrow in FIG. 12), whereby the grip member 1232 is allowed to grip the vertically postured test tray TT.

When the grip member 1232 grips the test tray TT which is vertically postured in the test chamber 130, the piston rod 1250a of the cylinder 1250 is then moved forward to rotate the rotation lever 1231 forwardly (as indicated by an arrow in FIG. 13), whereby the vertical posture of the test tray TT is changed to a horizontal state, and the horizontally postured test tray TT is located at the ascent start position USP. To assist this operation, the driving rollers 1221b, the driven rollers 1221a, and the chains 1221c are rotated to some degree.

Figure 13:
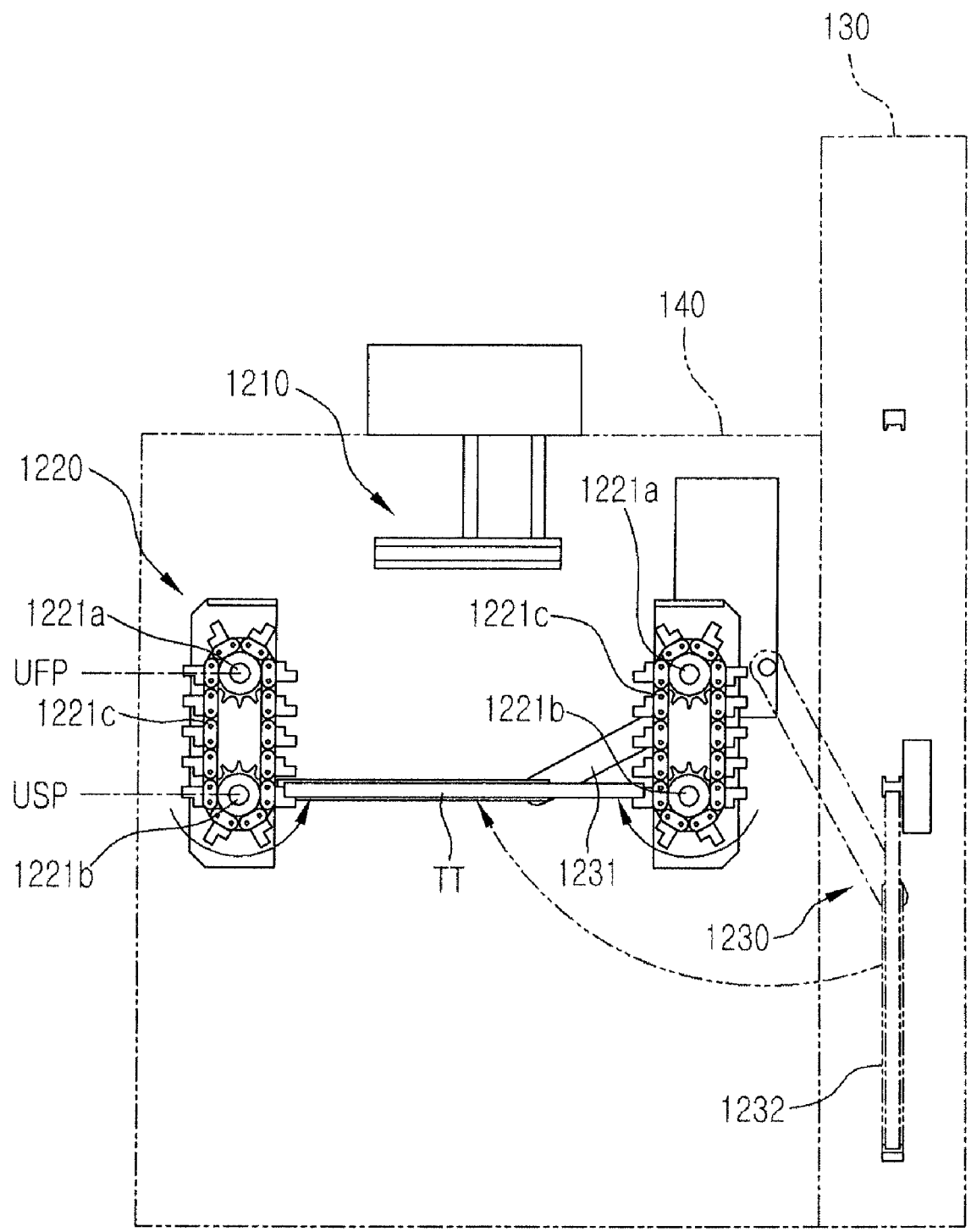
Figure 14:
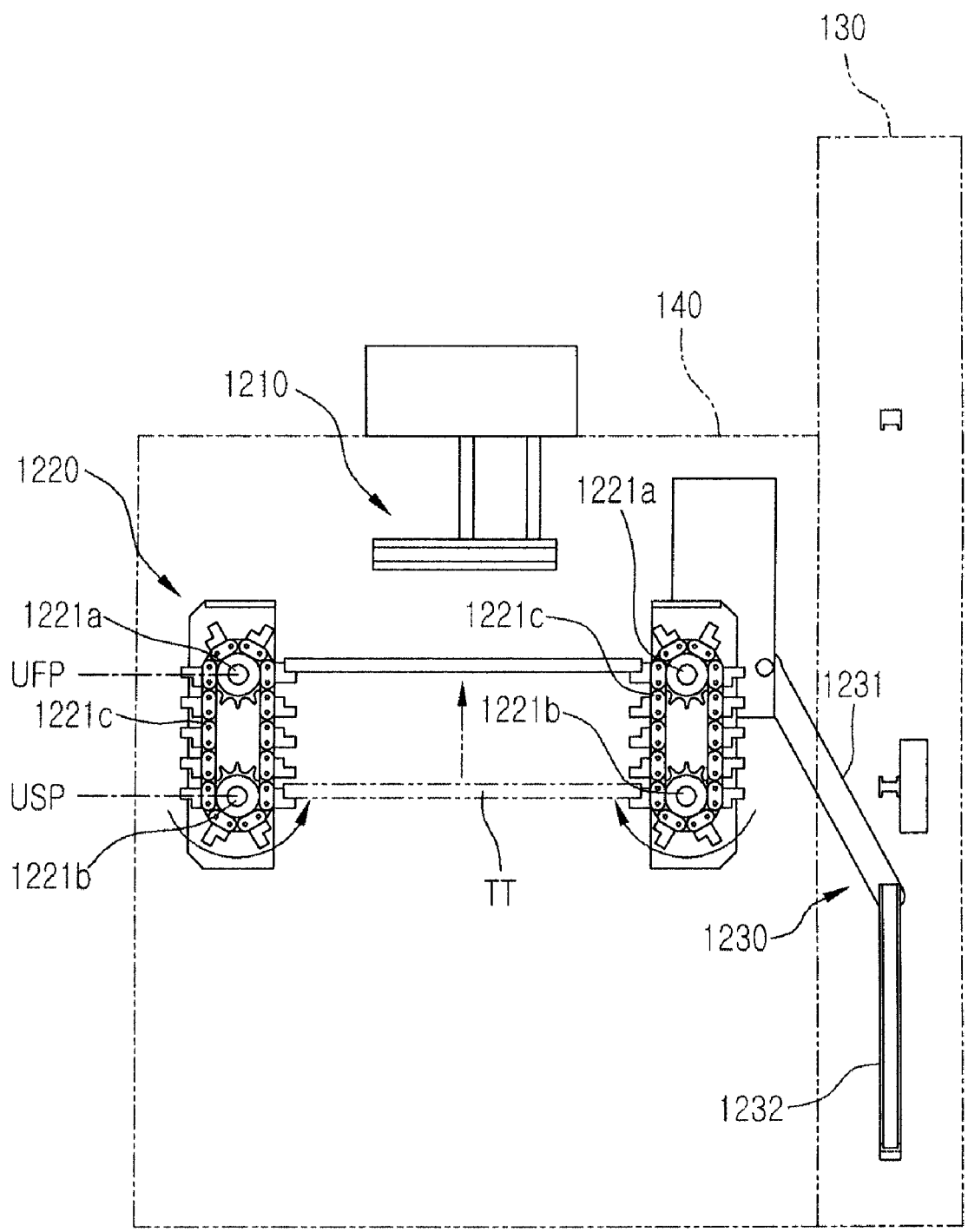

If the test tray is placed at the ascent start position USP as shown in FIG. 13, the motor 1240 is operated to rotate the chains 1221c (as indicated by a solid-line arrow in FIG. 14), whereby the test tray TT is raised up to the ascent finish position UFP (as indicated by a dotted-line arrow in FIG. 14), as shown in FIG. 14. Here, the chains 1221c can be set to be rotated step by step or rotated continuously, if necessary, to raise the test tray TT up to the ascent finish position UFP.

Figure 15:
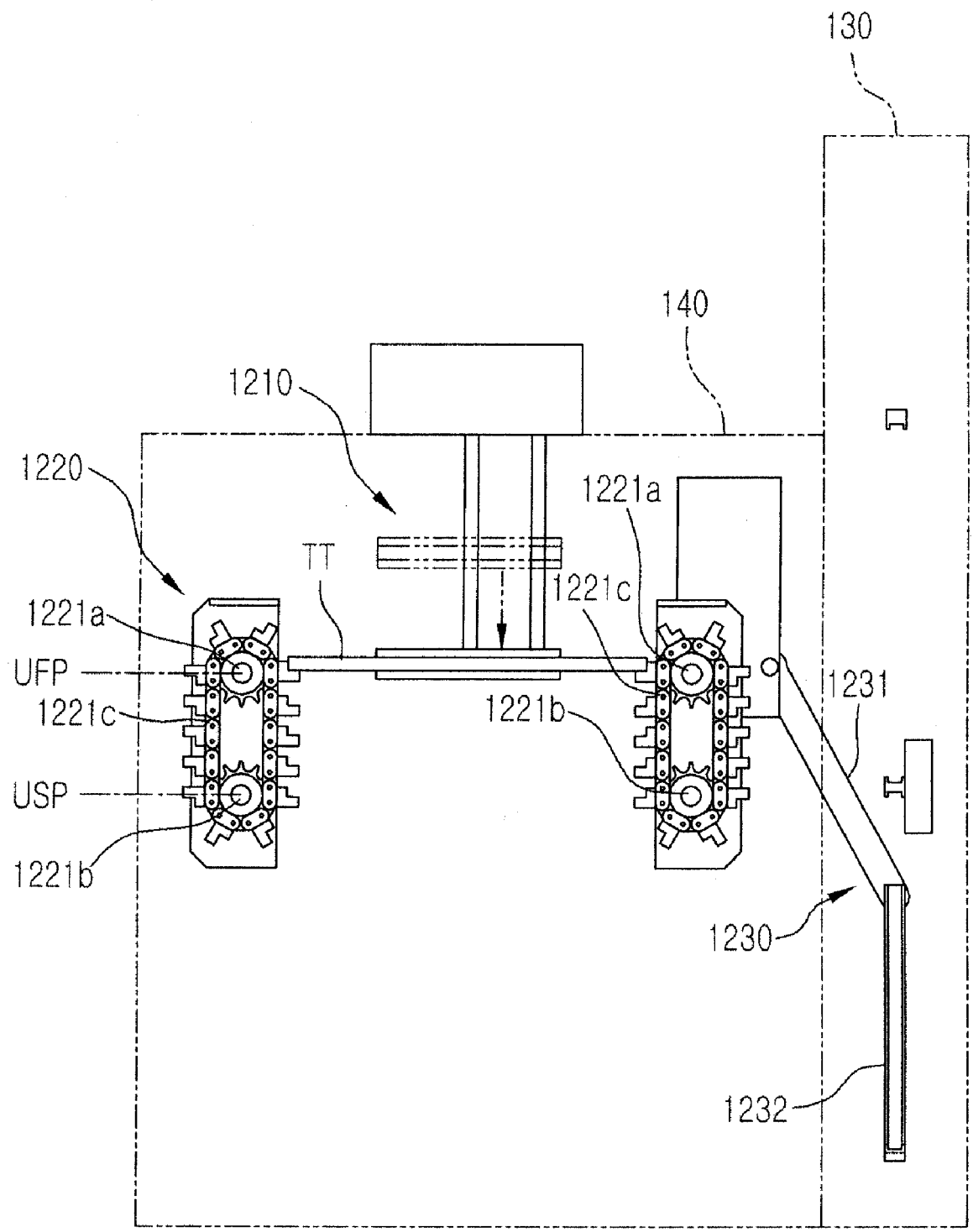
Figure 16:
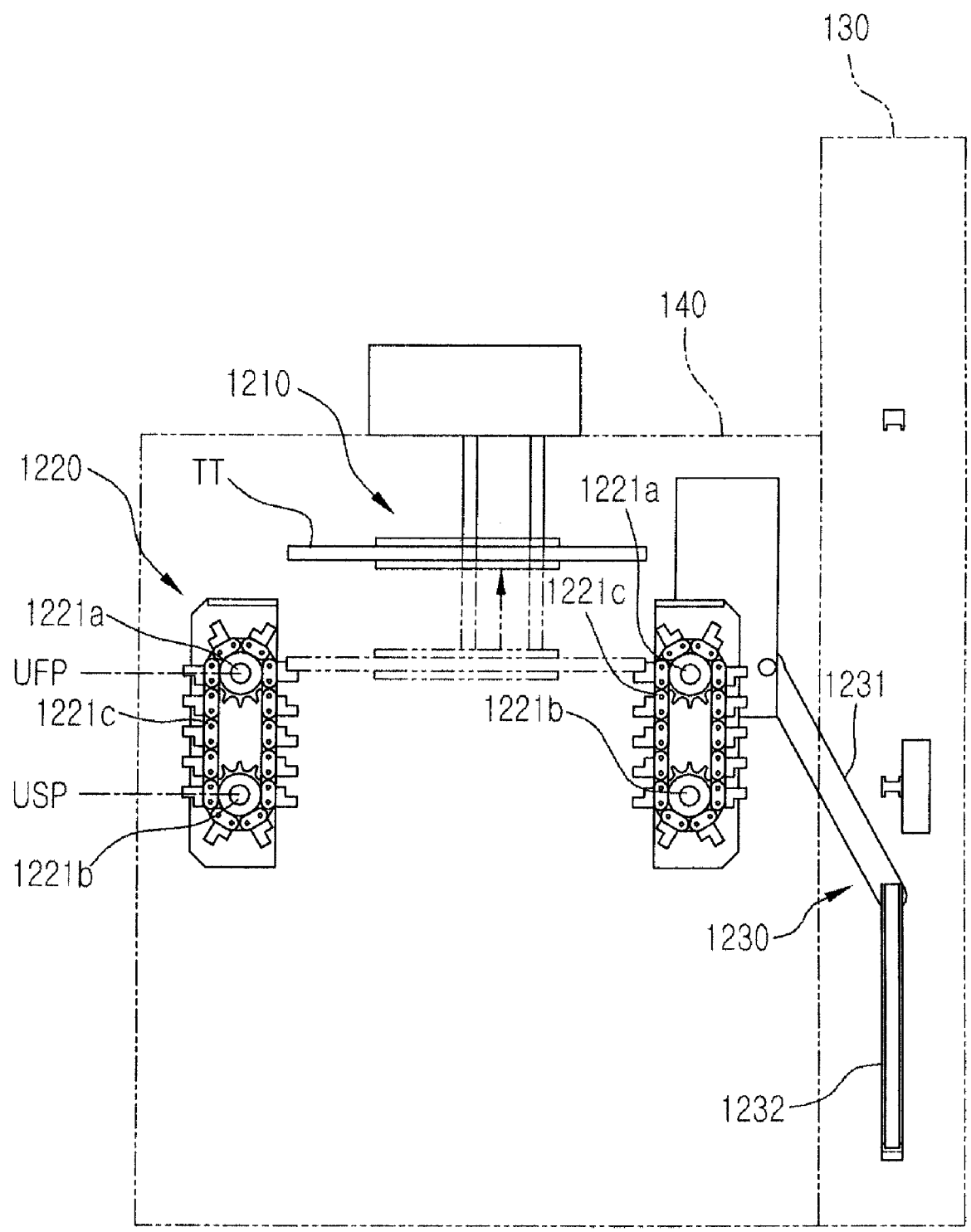
Figure 17:
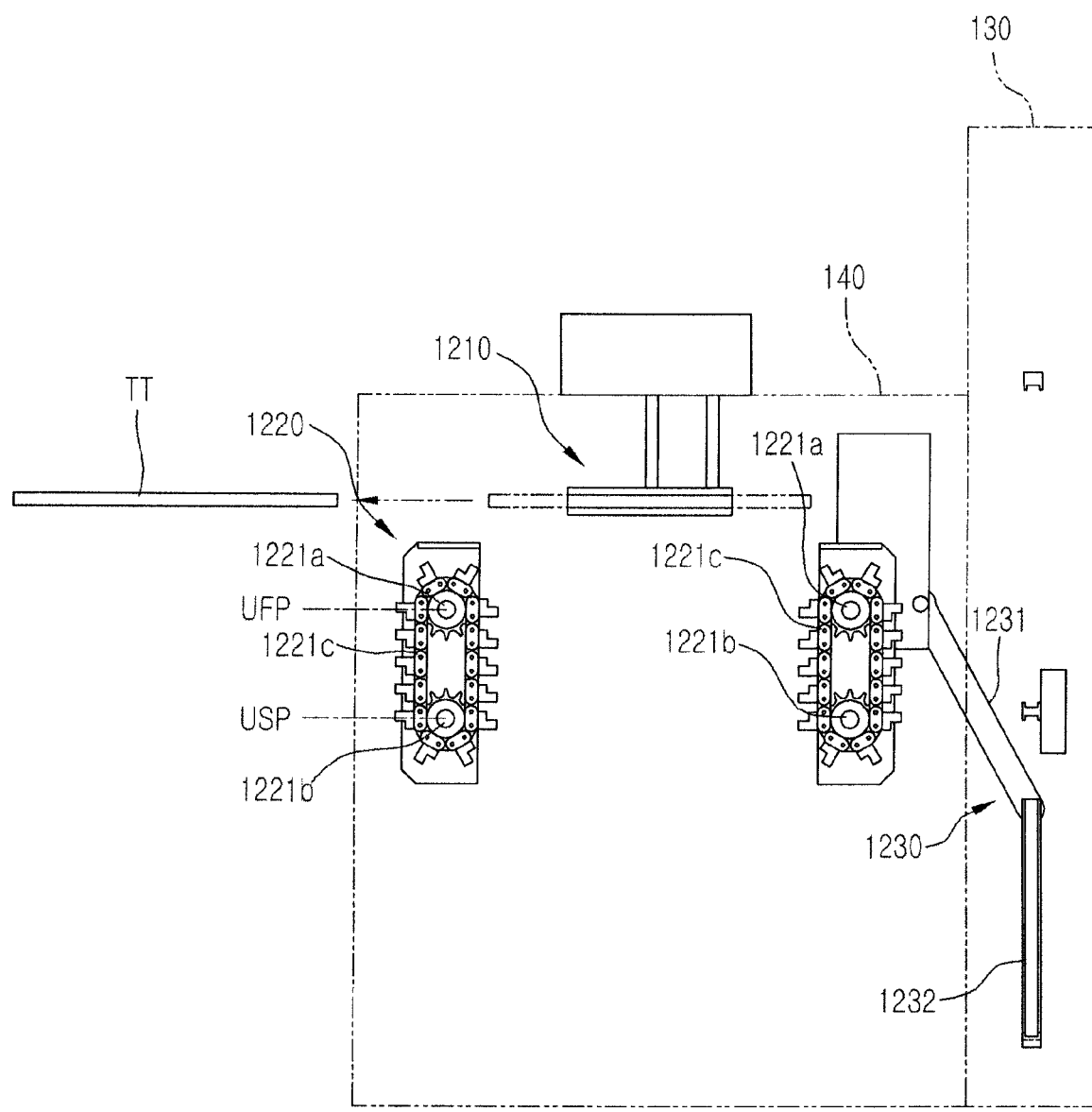

Subsequently, if the test tray TT reaches the ascent finish position UFP, the tray detaching mechanism 1210 descends (as indicated by an arrow in FIG. 15) and holds the test tray TT at the ascent finish position UFP, as shown in FIG. 15. Then, as illustrated in FIG. 16, the tray detaching mechanism 1210 moves the test tray TT upward to a position from which the teat tray TT is transferred to the unloading position (as indicated by an arrow in FIG. 16), and the test tray TT is then transferred to the unloading position by a pusher (not shown), as shown in FIG. 17.

Though the above embodiments have been described for the test handler in accordance with the present invention, the technical essence of the present invention resides in a test tray transferring apparatus for transferring the test tray inside the soak chamber and the desoak chamber. That is, in accordance with the present invention, by providing the descending mechanism and the vertical posture changing mechanism inside the soak chamber while providing the ascending mechanism and the horizontal posture changing mechanism inside the desoak chamber, the test handler can perform such operations as described in the above embodiment. Accordingly, the test tray transferring apparatus in the side-docking type test handler is a principal feature of the present invention, and this inventive test tray transferring technology is used for the transfer of the test tray in the soak chamber and the desoak chamber.

While the invention has been shown and described with respect to the embodiments it will be understood by those skilled in the art that various changes and modifications can be made without departing from the scope of the invention as defined in the following claims.

What is claimed is:

1. A side-docking type test handler comprising:
   a loading unit for loading untested semiconductor devices into a test tray which is at a loading position;
   a soak chamber for per-heating or pre-cooling the semiconductor devices loaded in the test tray transferred from the loading position in a horizontal state;
   a test chamber for allowing the untested semiconductor devices, which are loaded in the test tray transferred from the soak chamber, to be tested therein;
   a desoak chamber for recovering the temperature of the semiconductor devices loaded in the test tray transferred from the test chamber;
   an unloading unit for unloading the semiconductor devices, which are loaded in the test tray transferred from the desoak chamber to an unloading position, into customer trays while classifying the tested semiconductor devices into several classes depending on test results;
   a descending mechanism for lowering the horizontally postured test tray, which has been transferred into the soak chamber, down to a descent finish position;
   a vertical posture changing mechanism for changing the posture of the test tray, which has been lowered to the descent finish position, from the horizontal state to a vertical state, to transfer the test tray into the test chamber; and
   a horizontal posture changing mechanism for changing the posture of the test tray from the vertical state to the horizontal state before the test tray is transferred to the unloading position.

2. The test hander of claim 1, wherein the vertical posture changing mechanism transfers the test tray, which has been lowered to the descent finish position, into the test chamber while changing the posture of the test tray to the vertical state.

3. The test handler of claim 1, further comprising:
   an ascending mechanism for raising the test tray, which is horizontally located at an ascent start position inside the desoak chamber, up to an ascent finish position, wherein the horizontal posture changing mechanism transfers the test tray, which has been transferred from the test chamber, to the ascent start position while changing the posture of the test tray to the horizontal state.

4. A side-docking type test handler comprising:
a loading unit for loading untested semiconductor devices into a test tray which is at a loading position;
a soak chamber for per-heating or pre-cooling the semiconductor devices loaded in the test tray transferred from the loading position in a horizontal state;
a test chamber for allowing the untested semiconductor devices, which are loaded in the test tray transferred from the soak chamber, to be tested therein;
a desoak chamber for recovering the temperature of the semiconductor devices loaded in the test tray transferred from the test chamber;
an unloading unit for unloading the semiconductor devices, which are loaded in the test tray transferred from the desoak chamber to an unloading position, into customer trays while classifying the tested semiconductor devices into several classes depending on test results;
a vertical posture changing mechanism for changing the posture of the test tray from the horizontal state to a vertical state for transferring the test tray into the test chamber;
a horizontal posture changing mechanism for transferring the test tray, which has been transferred from the test chamber, to an ascent start position while changing the posture of the test tray to the horizontal state; and
an ascending mechanism for raising the horizontally postured test tray, which has been transferred to the ascent start position by the vertical posture changing mechanism, up to an ascent finish position inside the desoak chamber.

5. A method for transferring test trays in a side-docking type test handler, comprising:
(a) transferring a test tray in a horizontal state from a loading position into a test chamber via a soak chamber after semiconductor devices are loaded completely thereon, wherein the posture of the test tray is changed from the horizontal state to a vertical state at a point while it is transferred;
(b) after the completion of a test of semiconductor devices loaded in the test tray transferred into the test chamber, transferring the test tray to an ascent start position inside a desoak chamber while changing the posture of the test tray from the vertical state to the horizontal state;
(c) raising the test tray from the ascent start position to an ascent finish position inside the desoak chamber;
(d) transferring the test tray from the ascent finish position to an unloading position; and
(e) transferring the test tray from the unloading position to the loading position after the semiconductor devices are unloaded completely therefrom.

* * * * *